United States Patent

Pichon

[11] 4,096,748
[45] Jun. 27, 1978

[54] WHEATSTONE BRIDGE MEASURING CIRCUIT

[75] Inventor: Michel Pichon, Fontenay, Bois, France

[73] Assignee: Compagnie Internationale pour l'Informatique CII-Honeywell Bull (Societe Anonyme), Paris, France

[21] Appl. No.: 753,305

[22] Filed: Dec. 22, 1976

[30] Foreign Application Priority Data

Dec. 31, 1975 France .................. 75 40363

[51] Int. Cl.² .......................... G01K 7/20; G05F 3/02
[52] U.S. Cl. ........................... 73/362 AR; 323/75 N
[58] Field of Search ............... 73/362 AR; 323/75 H, 323/75 R, 75 N; 324/63

[56] References Cited

U.S. PATENT DOCUMENTS

| 2,971,379 | 2/1961 | Weisheit | 73/362 AR |
|---|---|---|---|
| 3,087,338 | 4/1963 | Horbinsui et al. | 73/362 AR |
| 3,377,862 | 4/1968 | Gheorghiv | 323/75 H X |
| 3,688,581 | 9/1972 | Le Quernec | 73/362 AR |
| 3,964,315 | 6/1976 | Engelhardt | 73/362 AR |

*Primary Examiner*—Richard C. Queisser
*Assistant Examiner*—John S. Appleman
*Attorney, Agent, or Firm*—Lowe, King, Price & Markva

[57] ABSTRACT

Temperatures are automatically measured with a Wheatstone bridge including first and second branches and a diagonal connected between taps of the branches. The first branch includes first and second series connected resistors respectively having values of P and Q; the second branch includes third and fourth series connected resistors respectively having values of R and A. A voltage source, having a value E, is connected to energize the branches in parallel. The third resistor is temperature responsive and has a positive temperature coefficient so that the value of R is given by:

$$R = R_0(1 + \alpha_0 T)$$

wherein
$R_0$ = the resistance value of the third resistor at 0° C,
$\alpha_0$ = the temperature coefficient of the third resistor, and
$T$ = temperature in degrees Centigrade.

The values of the remaining resistors are temperature independent, and together with the value of E, are selected so that the voltage read from a voltmeter connected in the diagonal is directly proportional to the temperature of the third resistor. In particular, $$E = \frac{(k+1)^2}{\alpha_0 k} \cdot 10^{-n}$$

wherein
$k$ = the ratio P/Q and is much less than 1, and
$n$ = a positive integer dependent on the temperature range to be measured.

9 Claims, 1 Drawing Figure

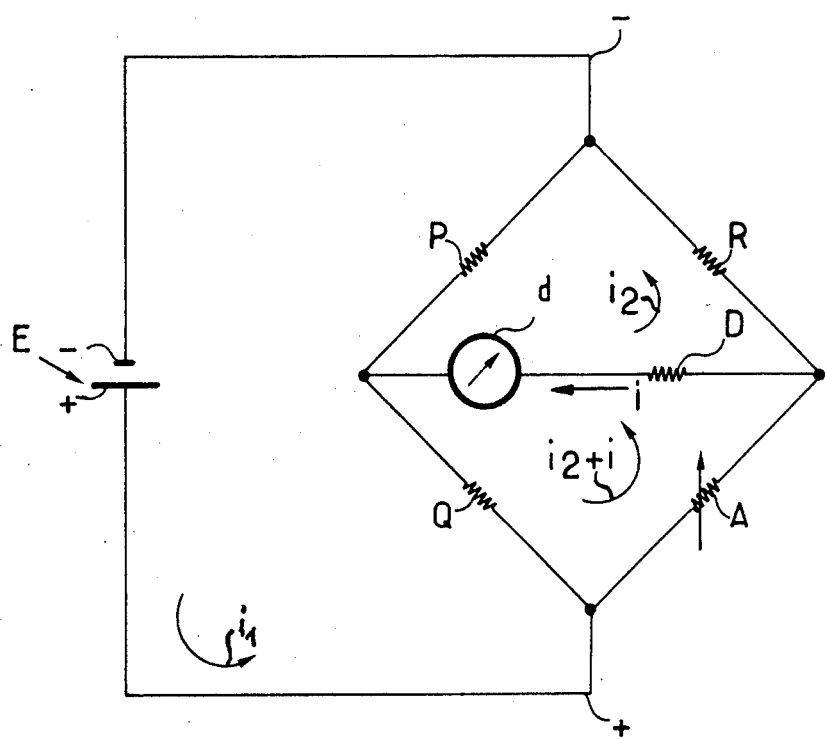

4,096,748

WHEATSTONE BRIDGE MEASURING CIRCUIT

FIELD OF THE INVENTION

The present invention relates generally to Wheatstone bridge circuits for measuring parameters that vary the value of an impedance of the bridge, and more particularly to a Wheatstone bridge measuring circuit in which the values of the bridge energizing voltage and fixed bridge impedances are selected to enable the voltage across a diagonal of the bridge to be directly proportional to the value of the measured parameter. The invention is particularly related to measuring ambient, room temperatures, as well as other temperatures at other ranges.

BACKGROUND OF THE INVENTION

It is known to measure many physical parameters by using a Wheatstone bridge measuring circuit. Typically, the Wheatstone bridge measuring circuit includes two parallel branches, each of which includes two series arms. In one of the arms, a parameter responsive impedance, such as a temperature responsive resistor, is connected.

To determine the value of the variable impedance, and therefore the value of the parameter being monitored, the prior art bridges are generally adjusted to be in a balanced state, whereby a null voltage is developed across a diagonal of the bridge. The diagonal is between taps on the two branches. The bridge can be activated to a balanced condition either manually or automatically, by adjusting values of impedances, other than the monitoring impedance, of the bridge. After balance has been achieved, the value of the variable parameter responsive impedance is calculated by using the well known balance equation. From the calculated value of the parameter responsive impedance, the value of the parameter is calculated from a known relationship between the parameter value and the impedance value of the parameter responsive impedance. These calculations can be performed either manually or automatically.

It is thus seen that in the prior art devices, the apparatus is either relatively simple, but requires many manual adjustments and calculations, or very complex to provide an automatic indication of the measured parameter. If a completely manual approach is taken, continued rebalancing of the bridge is necessary by an operator, as well as numerous hand calculations. If a completely automatic approach is taken, the apparatus is quite complex because of automatic, feedback circuitry which must be employed, together with relatively complex calculating equipment. If a combination of these approaches is taken, the apparatus has a tendency to be complex and several manual operations must be performed.

It is, accordingly, an object of the present invention to provide a new and improved Wheatstone bridge circuit for measuring a parameter that causes an impedance value of the bridge to be varied.

Another object of the invention is to provide a new and improved Wheatstone bridge measuring circuit wherein the value of a monitored parameter is derived without complex circuitry or manual operations, other than reading a meter, once initial conditions have been established in the bridge.

Another object of the invention it to provide a Wheatstone bridge temperature measuring circuit wherein the temperature of a temperature responsive resistor is derived without using time consuming balancing operations or complex balancing equipment.

BRIEF DESCRIPTION OF THE INVENTION

In accordance with the invention, the value of a parameter monitored by an impedance of a Wheatstone bridge is indicated directly by the voltage across the diagonals of the bridge. The indication is derived without rebalancing the bridge each time a measurement is made, to obviate the need for manual operations and/or calculations, as well as automatic, complex rebalancing apparatus, or automatic computing apparatus. Therefore, the automatic measuring apparatus of the present invention is easily constructed and is inexpensive to manufacture and operate because there are a minimum number of parts and no manual steps after initial calibration. The result is achieved by proper selection of the values for an energizing voltage source for the bridge and fixed impedances of the bridge that are not responsive to the parameter being monitored.

The invention is particularly applicable to monitoring temperatures with positive temperature coefficients, heat responsive resistors having values that vary in accordance with:

$$R = R_o(1 + \alpha_o T) \tag{1}$$

wherein:
 $T$ = temperature in degrees Centigrade of the resistor,
 $R$ = the resistance of the resistor at temperature T,
 $R_o$ = the value of the resistor at 0° C, and
 $\alpha_o$ = the temperature coefficient of resistance of the resistor.

The invention can also be used to monitor parameters other than temperature, if these parameters cause impedance variations in the same form as indicated by Equation (1).

In addition to the monitoring, variable impedance element, the bridge includes fixed impedances in the branch opposite from the branch including the parameter monitoring impedance; these fixed impedances have a value so that they form a voltage divider having a tap with a voltage that is a small percentage of the energizing voltage for the bridge. The ratio of these fixed impedances is equal to $k$ so the voltage division factor is designated $$\frac{k}{k+1}$$

the value E is selected in accordance with:

$$E = \frac{(k+1)^2}{\alpha_o k} \cdot 10^{-n} \tag{2}$$

wherein:
 $n$ = a positive integer having a value dependent upon the range of parameter values to be monitored by the variable impedance responsive to the measured parameter.

To monitor room temperatures (approximately 20°–30° C), $n = 3$.

In accordance with another feature of the invention, no adjustments of the bridge are necessary after it has been initially calibrated. Initial calibration is attained by providing a manually controlled, variable impedance in an arm of the bridge in series with an arm including the monitoring impedance. The value of the manually controlled variable impedance is adjusted while the monitoring impedance is responsive to a parameter having a known value, e.g., a predetermined temperature. The manually controlled impedance is adjusted until the voltage across the bridge diagonal equals the predetermined value sensed by the monitoring impedance. Prior to adjustment, the value (A) of the manually controlled impedance is selected to provide bridge balance, whereby:

$$A = \frac{R_o}{k}$$

It is accordingly a further object of the invention to provide a new and improved method of operating a Wheatstone bridge so that it is initially adjusted to provide a predetermined output and does not thereafter require manual or automatic rebalancing.

It is a further object of the invention to provide a new and improved Wheatstone bridge monitoring circuit wherein impedance values of the bridge and the value of a voltage source energizing the bridge are selected to enable the voltage across a diagonal of the bridge to be directly related to the monitored parameter.

These and other objects and advantages of this invention will become apparent upon reading the following description, of which the attached drawings form a part.

BRIEF DESCRIPTION OF THE DRAWING

The single FIGURE is a circuit diagram of a preferred embodiment of the invention.

DETAILED DESCRIPTION OF THE DRAWING

Reference is now made to the single FIGURE of the drawing wherein there is illustrated a Wheatstone bridge energized by a DC voltage source E, having an internal, relatively low resistance $\rho$. The Wheatstone bridge includes a pair of parallel branches which are driven by source E. In a first branch, a temperature responsive resistor R forms one arm that is series connected with a variable, manually controlled resistor A that is unresponsive to temperature variations of resistor R. In a second branch of the bridge, a first arm includes a fixed, resistor P, connected in series with fixed resistor Q that forms a second arm of the bridge; resistors P and Q are also unresponsive to temperature variations of resistor R. (The values of source E, and resistors P, Q, R and A are respectively indicated by E, P, Q, R, and A.) The relative values of resistors P and Q are selected so that P/Q equals a relatively small number $k$, e.g., $k = 10^{-2}$.

Each branch of the bridge includes a tap having a common connection with the two resistors forming the branch. Thereby, each branch of the bridge can be considered as a voltage divider so that a constant voltage $$\frac{kE}{k+1}$$

is derived at the tap of the first branch and a variable voltage is derived at the tap of the second branch; the variable voltage is dependent upon the temperature to which resistor R is subjected and the value of resistor A. Resistor R has a positive temperature coefficient whereby the value of the resistor, for a particular temperature T, in degrees Centigrade, is given by Equation (1), supra. Temperature sensing resistor R is preferably fabricated of copper because a copper temperature sensor is easy to fabricate and the net heating of the copper is negligible.

A diagonal of the bridge is formed between the taps of the two branches. The diagonal includes a voltage detector $d$ having an internal resistance D which is much greater than the values of any of resistors P, Q, R or A. Thereby, relatively small currents flow through the diagonal of the bridge even if there is an appreciable bridge imbalance. The internal impedance $\rho$, of source E, is much lower than the values of any of resistors P, Q, R or A, as well as the internal resistance D of detector $d$. Typically, detector $d$ is a voltmeter, but in certain applications, relating to temperature measurements and to measurements of other parameters, it is advantageous to connect a high impedance recorder in parallel with the voltmeter or in place of the voltmeter.

In response to the voltage of source E and the values of resistors P, Q, R and A, as well as the internal impedance of voltage detector $d$, numerous mesh currents flow in the circuit. In particular, the mesh current $i_1$ flows from source E to the bridge, a mesh current $i_2$ flows through resistors P and R, a current $i$ flows through the diagonal, and a current $i_2 + i$ flows through resistors Q and A.

The values of resistors P, Q, R and A, as well as the voltage of source E, are selected so that the voltage monitored by detector $d$, which is indicative of the bridge imbalance, is directly proportional to the temperature monitored by resistor R. The values of E, $k$, and the temperature coefficient of resistor R are related to the temperature T of resistor R in accordance with Equation (2), supra so that the voltage $u$ across the bridge diagonal is directly related to temperature in accordance with:

$$u = T \cdot 10^{-n} \quad (3)$$

The proof of Equations (2) and (3) can be derived from the following analysis of the bridge circuit, utilizing the Kirchoff current and voltage laws. In particular, $$\begin{aligned} -Qi + (P + Q + \rho)i_1 - (P + Q)i_2 &= E \\ -Di\phantom{xxxx} - Pi_1 + (P + R)i_2 &= O \\ (A + D + Q)i - Qi_1 + (A + Q)i_2 &= O \end{aligned} \quad (4)$$

From Equation (4), the current in the diagonal can be deduced as:

$$i = \frac{E(QR - AP)}{Z} \quad (5)$$

where:

$$z = D\rho(A+P+Q+R) + D(A+R)(P+Q) + AR(P+Q) + PQ(A+R) + \rho(P+R)(A+Q) \quad (6)$$

Because the internal resistance, $\rho$, of source E has a negligible value compared to the values of resistors A, P, Q, and R, the value of Z can be rewritten as:

$$Z = AR(P+Q) + PQ(A+R) + D(A+R)(P+Q) \quad (7)$$

Because the internal resistance, D, of voltage detector $d$, is much greater than the sum of the resistances of the parallel connections of the two arms of the first branch and the parallel connections of the two arms of the second branch:

$$Z = D(A+R)(P+Q) \quad (8)$$

In other words, the value of D is much greater than:

$$\frac{AR}{A+R} + \frac{PQ}{P+Q}$$

which can be rewritten as:

$$\frac{AR(P+Q) + PQ(A+R)}{(A+R)(P+Q)}$$

From Equations (5) and (8), the voltage $u$, across the diagonal of the bridge, can be represented as:

$$u = Di = \frac{E(QR - AP)}{(A+R)(P+Q)} \quad (9)$$

Equation (9) represents the imbalance voltage of the bridge.

Because of the relationship between the value of the resistor R and temperature, as expressed by Equation (1), the value of $u$ is directly proportional, to T, provided that bridge balance exists at the reference temperature of 0° C. In other words, $$R_o = KA = \frac{AP}{Q} \quad (10)$$

by substituting Equations (1) and (10) into Equation (9), the imbalance voltage across the bridge diagonal can be written as:

$$u = \frac{EQR_o\alpha_oT}{\left[\frac{R_0}{K} + R_o(1 + \alpha_oT)\right](P+Q)} = \quad (11)$$

$$\frac{E\alpha_oT}{\frac{(k+1)^2}{k} + (k+1)\alpha_oT}$$

from which it follows that the temperature monitored by resistor R is:

$$T = \frac{u}{E} \cdot \left[\frac{(k+1)^2}{\alpha_ok} + (k+1)T\right] \quad (12)$$

From Equation (12), it is apparent that the temperature T is proportional to the bridge imbalance voltage $u$. The imbalance voltage is generally quite low, on the order of millivolts, so that the range of temperatures at which the device is adapted to operate is in the room temperature range, from a few degrees Centigrade to several decades of degree Centigrade. For this range, the bridge imbalance is represented by $$T = u \cdot 10^n \quad (13)$$

wherein $n$ = a positive integer.

A typical value of $n$ is 3 when $u$ is on the order of a few millivolts and room temperatures are to be measured.

Equation (12) can be rewritten as:

$$T = u \cdot 10^n = \quad (14)$$

$$\frac{u}{E}\left[\frac{(k+1)^2}{\alpha_ok} + (k+1)10^nu\right]$$

from which it follows that $$E = \left[\frac{(k+1)^2}{\alpha_ok}10^{-n} + (k+1)u\right] \cdot \cdot \quad (15)$$

If the value of $k$ is chosen so that the term $(k+1)u$ is negligible compared to:

$$\frac{(k+1)^2}{\alpha_ok}, \quad (16)$$

the bridge can be energized by a voltage:

$$E = \frac{(k+1)^2 10^{-n}}{\alpha_ok} \quad (17)$$

Equation (17) enables the bridge inbalance voltage to provide an automatic indication, in degrees Centigrade, of the temperature of resistor R.

If room temperature is measured, the bridge diagonal voltage ($u$) is expressed in millivolts, and $n = 3$, the energizing voltage is expressed as:

$$E = \frac{(k+1)^2 10^{-3}}{\alpha_ok} \quad (18)$$

Because resistor R is preferably a copper resistance, having a temperature coefficient $\alpha_o = 1/234.5$, and if $P/Q = k$ is selected to equal 0.01 (e.g., if $P = 100$ ohms and $Q = 10{,}000$ ohms), E is expressed as:

$$E = \frac{(1.01)^2}{0.01 \times \frac{1}{234.5} \times 10^3} = 23.92 \text{ volts.} \quad (19)$$

For this energizing voltage ($E = 23.92$ volts) detector $d$ is a millivoltmeter. The term $(k+1)u$ from Equation (15) is equal to $1.01u$, which is negligible compared to the energizing voltage $E = 23.92$ because $u$ is on the order of a few millivolts.

As indicated supra, resistor A is variable. In order for the apparatus to function properly, resistor A initially is manually adjusted to obtain a temperature value detector $d$ that equals a reference, measured temperature to which resistor R is subjected. The reference temperature is determined, for example, with the aid of a calibrated thermometer. In other words, the value of resistor A is manually controlled until the temperature reading of detector $d$ corresponds with the temperature to which resistor R is subjected. After resistor A has been adjusted and the apparatus has been calibrated, the bridge imbalance voltage, as monitored by voltage detector $d$, automatically indicates the temperature to which resistor R is subjected.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. Apparatus for automatically measuring parameters comprising a Wheatstone bridge including first and second branches and a diagonal connected between taps of the first and second branches, the first branch including first and second series connected resistors having values P and Q, the second branch including third and fourth series connected resistors, respectively having values R and A, said third resistor being responsive to the measured parameter in accordance with:

$$R = \frac{(1 + \alpha_0 T)}{R_0} \quad (1)$$

where:

$R_o$ = the value of said third resistor when said parameter has a value $T_o$;

$T$ = the value of the parameter sensed by the third resistor, and $\alpha_o$ = the temperature coefficient of said third resistor, the diagonal including a voltage detector having an internal resistance D, the voltage detector being connected to a common terminal of the first and second resistances and a common terminal of the third and fourth resistors; a voltage source for energizing the bridge, the source having a value E, such that:

$$E = \frac{(k + 1)^2}{\alpha_0 k} \cdot 10^{-n} \quad (2)$$

where $k$ = the ratio P/Q and $k$ is much less than 1; and $n$ = an integer that is a function of the range of the parameters to be measured.

2. The apparatus of claim 1 wherein the first, second and fourth resistors have relatively constant values over the range of the parameters to be measured, the voltage source having an internal resistance $\rho$ with a negligible value compared with the values of the first, second, third and fourth resistors, the value D of the internal resistance of the detector being much greater than $$\frac{AR}{R + A} + \frac{PQ}{P + Q}.$$

3. Apparatus of claim 2 wherein the third resistor is made of a material that is subject to variations of resistance as a function of temperature.

4. The apparatus of claim 1 wherein $n = 3$, and the third resistor senses temperature and is positioned to be responsive to room temperature.

5. Apparatus for measuring a parameter comprising a Wheatstone bridge having first and second voltage dividers, each of said voltage dividers having a tap and being connected across a voltage source having a value E, a voltage detector connected in a diagonal of the bridge between the taps of the first and second voltage dividers, the first voltage divider including impedance means so that the voltage at the tap of the first divider equals $$\frac{E}{k + 1},$$

where $k << 1$ and is independent of the value of the measured parameter, the second divider including a variable impedance connected between the tap of the second divider and a terminal of the source, so that when the bridge is balanced the voltage across the variable impedance equals $$\frac{E}{k + 1};$$

said variable impedance varying as a function of the parameter, the value of E being such that:

$$E = \frac{(k + 1)^2}{\alpha_0 k} \cdot 10^{-n}$$

where $\alpha_o$ is a coefficient indicating the manner in which the variable parameter affects the value of the variable impedance, and $n$ is an integer that is a function of the range of values of the parameter to be measured, and wherein the value of the variable impedance is:

$$R = R_o(1 + \alpha_o T)$$

where:

$T$ = the value of the parameter being measured, and $R_o$ = the value of the variable impedance when T has a predetermined value equal to $T_o$.

6. The apparatus of claim 5 wherein the first voltage divider includes first and second impedances respectively having values of P and Q, the second voltage divider includes third and fourth impedances respectively having values of R and A, whereby $P/Q = k$, the source having a negligible internal impedance, $\rho$, compared with the values of A, P, Q, and R, the value of A being variable to establish bridge equilibrium at a reference value of T, so that at the reference value of T, $R = kA$, the voltage detector having an internal resistance much larger than $$\frac{AR}{A + R} + \frac{PQ}{P + Q},$$

whereby the bridge diagonal voltage to which the detector responds is $T \times 10^{-n}$.

7. A method of measuring the values of a parameter with a Wheatstone bridge having first and second voltage dividers, each of said voltage dividers having a tap and being connected across a voltage source having a value E, a voltage detector connected in a diagonal to the bridge between the taps of the first and second voltage dividers, the first voltage divider including impedance means so that the voltage at the tap of the first divider equals $$\frac{E}{k + 1},$$

where $k$ is independent of the value of the measured parameter, the second divider including a variable impedance connected between the tap of the second divider and a terminal of the source, so that when the bridge is balanced the voltage across the variable impedance equals $$\frac{E}{k + 1};$$

said variable impedance varying as a function of the parameter, and in accordance with $$R = R_o(1 + \alpha_o T)$$

wherein:
- $T$ = the value of the variable parameter,
- $\alpha_o$ = a coefficient indicating the manner in which the variable parameter effects the value of R, and
- $R_o$ = the value of R when T equals a reference value of the parameter, selecting impedances of the first voltage divider so that $k \ll 1$, selecting the value of E such that:

$$E = \frac{(k+1)^2}{\alpha_o k} \cdot 10^{-n}$$

where:
- $n$ is an integer that is a function of the range of values of the parameter to be measured, and subjecting the variable impedance to a known value of the parameter, adjusting an impedance of the second voltage divider until a reading derived from the detector equals the known value, and then subjecting the variable impedance to the parameter so that the voltage detected by the detector directly indicates the value of the parameter.

8. The method of claim 7, wherein the first voltage divider includes first and second impedances respectively having values of P and Q, the second voltage divider includes third and fourth impedances respectively having values of R and A, whereby $P/Q = k$, the source having a negligible internal impedance, $\rho$, compared with the values of A, P, Q, and R, varying the value of A until the bridge is in equilibrium at a reference value of T so that at the reference value of T, $R_o = kA$.

9. The method of claim 8 further comprising selecting a voltage detector having an internal impedance much greater than $$\frac{AR}{A+R} + \frac{PQ}{P+Q}.$$

* * * * *